(12) United States Patent
Kim

(10) Patent No.: US 6,600,693 B2
(45) Date of Patent: Jul. 29, 2003

(54) METHOD AND CIRCUIT FOR DRIVING QUAD DATA RATE SYNCHRONOUS SEMICONDUCTOR MEMORY DEVICE

(75) Inventor: Min Kyu Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 76 days.

(21) Appl. No.: 09/991,049

(22) Filed: Nov. 21, 2001

(65) Prior Publication Data

US 2002/0060949 A1 May 23, 2002

(30) Foreign Application Priority Data

Nov. 23, 2000 (KR) .......................... 2000-70034

(51) Int. Cl.$^7$ ................................. G11C 8/00
(52) U.S. Cl. ............. 365/233; 365/330.06; 365/230.02; 365/189.05; 365/189.02; 711/167
(58) Field of Search ............................ 365/233, 230.06, 365/230.02, 189.05, 189.02; 711/167

(56) References Cited

U.S. PATENT DOCUMENTS

| | | |
|---|---|---|
| 5,091,889 A | 2/1992 | Hamano et al. |
| 5,508,964 A | 4/1996 | Toops |
| 5,559,752 A | 9/1996 | Stephens, Jr. et al. |
| 5,815,459 A * | 9/1998 | Park et al. .............. 365/230.06 |
| 5,898,611 A | 4/1999 | Yamada |
| 6,118,708 A | 9/2000 | Yoshida et al. |
| 6,381,684 B1 * | 4/2002 | Hronik et al. .............. 711/167 |

FOREIGN PATENT DOCUMENTS

| | | |
|---|---|---|
| JP | 7312089 | 11/1995 |
| JP | 0199257 | 7/1998 |

* cited by examiner

*Primary Examiner*—Vu A. Le
*Assistant Examiner*—Nam Nguyen
(74) *Attorney, Agent, or Firm*—Ladas & Parry

(57) ABSTRACT

The present invention discloses a method and circuit for driving a word line and a bit line for a read/write operation of a quad data rate synchronous semiconductor memory device which can perform the read/write operation in one cycle in the QDR device in which the read and write operations are individually performed in a double data rate (DDR) type, and which can read data in a burst length according to one address variation by using a prefetched method in the read operation. The method for driving the quad data rate synchronous semiconductor memory device includes the steps of: enabling a word line for a read operation by being synchronized with a rising edge of one clock cycle, and disabling word line and bit line select signals for the read operation before a falling edge; and enabling a word line for a write operation by being synchronized with the falling edge of the clock cycle, and disabling word line and bit line select signals for the write operation before a rising edge of a succeeding clock cycle.

17 Claims, 5 Drawing Sheets

METHOD AND CIRCUIT FOR DRIVING QUAD DATA RATE SYNCHRONOUS SEMICONDUCTOR MEMORY DEVICE

BACKGROUND OF THE INVENTION

1. Field of the Invention

The present invention relates to a method and circuit for driving a word line and a bit line for a read/write operation of a quad data rate (QDR) SRAM, and in particular to a method and circuit for driving a word line and a bit line for a read/write operation of a QDR SRAM which can perform the read and write operations in one cycle in the QDR device in which the read and write operations are individually performed in a double data rate (DDR), and which can read data in a burst length according to one address variation by using a prefetched method in the read operation.

2. Description of the Background Art

The SRAM performs data input and output through one pin. Since the data input and output are not individually controlled, the SRAM is designed to have limited data input and output frequencies. A zero bus turnaround (ZBT) SRAM has been suggested to solve the foregoing problem, but failed to perform the data input and output at the same time.

In order to solve a problem due to a turnaround time, the QDR SRAM completely separates data input and output pins. That is, the data input and output pins are provided to individually perform the data input and output. Here, the QDR implies that the data input and the data output can be driven in a double data rate (DDR).

However, when the conventional QDR SRAM reads or writes a data in different cycles, it cannot form a frequency in which the input and output are performed in the DDR.

SUMMARY OF THE INVENTION

Accordingly, it is a primary object of the present invention to provide a method and circuit for driving a word line and a bit line for a read/write operation of a quad data rate (QDR) SRAM which can perform the read and write operations in one cycle in the QDR device in which the read and write operations are individually performed in a double data rate (DDR).

Another object of the present invention is to provide a method and circuit for driving a word line and a bit line for a read/write operation of a QDR SRAM which can read data in a burst length according to one address variation by using a prefetched method in the read operation.

In order to achieve the above-described objects of the invention, there is provided a method for driving a QDR synchronous semiconductor memory device including the steps of: enabling a word line for a read operation by being synchronized with a rising edge of one clock cycle, and disabling word line and bit line select signals for the read operation before a falling edge; and enabling a word line for a write operation by being synchronized with the falling edge of the clock cycle, and disabling word line and bit line select signals for the write operation before a rising edge of a succeeding clock cycle.

The step for the read operation includes the steps of: simultaneously reading two memory cells in one read operation among a plurality of memory cells corresponding to the enabled word line; generating a first pulse which becomes a high level by being synchronized with the rising edge of the clock cycle, and which becomes a low level before the falling edge; and outputting data from the two memory cells by respectively synchronizing them with the rising edge and the falling edge of the first pulse. A semiconductor memory device is designed to simultaneously select two cells according to one column select signal in order to read the two cells at the same time.

The step for the write operation includes the steps of: generating a second pulse which becomes a high level by being synchronized with the falling edge of the clock cycle, and which becomes a low level before the rising edge of the succeeding clock cycle; and recording data on two memory cells by respectively synchronizing them with the rising edge and the falling edge of the second pulse.

There is also provided a circuit for driving a QDR synchronous semiconductor memory device, including: an address buffer for buffering an external address signal; a write address storing unit for receiving an address signal corresponding to a write operation from the address buffer, and storing the received signal; a read address storing unit for receiving an address signal corresponding to a read operation from the address buffer, and storing the received signal; and an address combining unit for receiving the write address signal from the write address storing unit and the read address signal from the read address storing unit, and combining the two address signals to be separated in time in one clock cycle.

The address combining unit includes: a read pulse address generating unit for receiving the read address signal from the read address storing unit, and outputting the read address signal synchronized with the rising edge of the clock cycle for a predetermined time of the read operation; a write pulse address generating unit for receiving the write address signal from the write address storing unit, and outputting the write address signal synchronized with the falling edge of the clock cycle for a predetermined time of the write operation; and a multiplexer for combining the output signal from the read pulse address generating unit and the output signal from the write pulse address generating unit.

The read pulse address generating unit finishes outputting the read address signal before the falling edge of the clock cycle. For this, the read pulse address generating unit includes a NAND gate having its one input terminal connected to receive the pulse signal which becomes a high level in the rising edge of the clock cycle and which becomes a low level before the falling edge, and its other input terminal connected to receive the output signal from the read address storing unit. The write pulse address generating unit finishes outputting the write address signal before the rising edge of the succeeding clock cycle. For this, the write pulse address generating unit includes a NAND gate having its one input terminal connected to receive the pulse signal which becomes a high level in the falling edge of the clock cycle and which becomes a low level before the rising edge of the succeeding clock cycle, and its other input terminal connected to receive the output signal from the write address storing unit. The multiplexer includes an OR gate having its one input terminal connected to receive the output signal from the read pulse address generating unit, and its other input terminal connected to receive the output signal from the write pulse address generating unit.

In addition, a method for driving a synchronous semiconductor memory device having a memory cell array for storing data includes the steps of: generating M (M is a natural number) pulses separated in time in one clock cycle when a burst length of the semiconductor memory device is 2N (N is a natural number); combining M addresses in one clock cycle by using the M pulses; and reading or writing 2M data from/on the memory cell array corresponding to the addresses, by respectively synchronizing them with the rising edges and falling edges of the M pulses.

According to the present invention, the read and write operations are performed in one cycle. It is thus possible to perform the read and write operations in the same ratio in the QDR device where the read and write operations are separately performed in the DDR. In addition, the prefetched method is applied to the read operation, so that the QDR SRAM can be designed in a burst length 2 reading and writing two data according to one address variation, a burst length 4 reading and writing four data according to one address variation, and other different burst lengths. Moreover, the word line and bit line decoder can be used through the muxing of the read and write addresses, instead of individually using a write decoder and a read decoder. As a result, a chip layout size is reduced.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
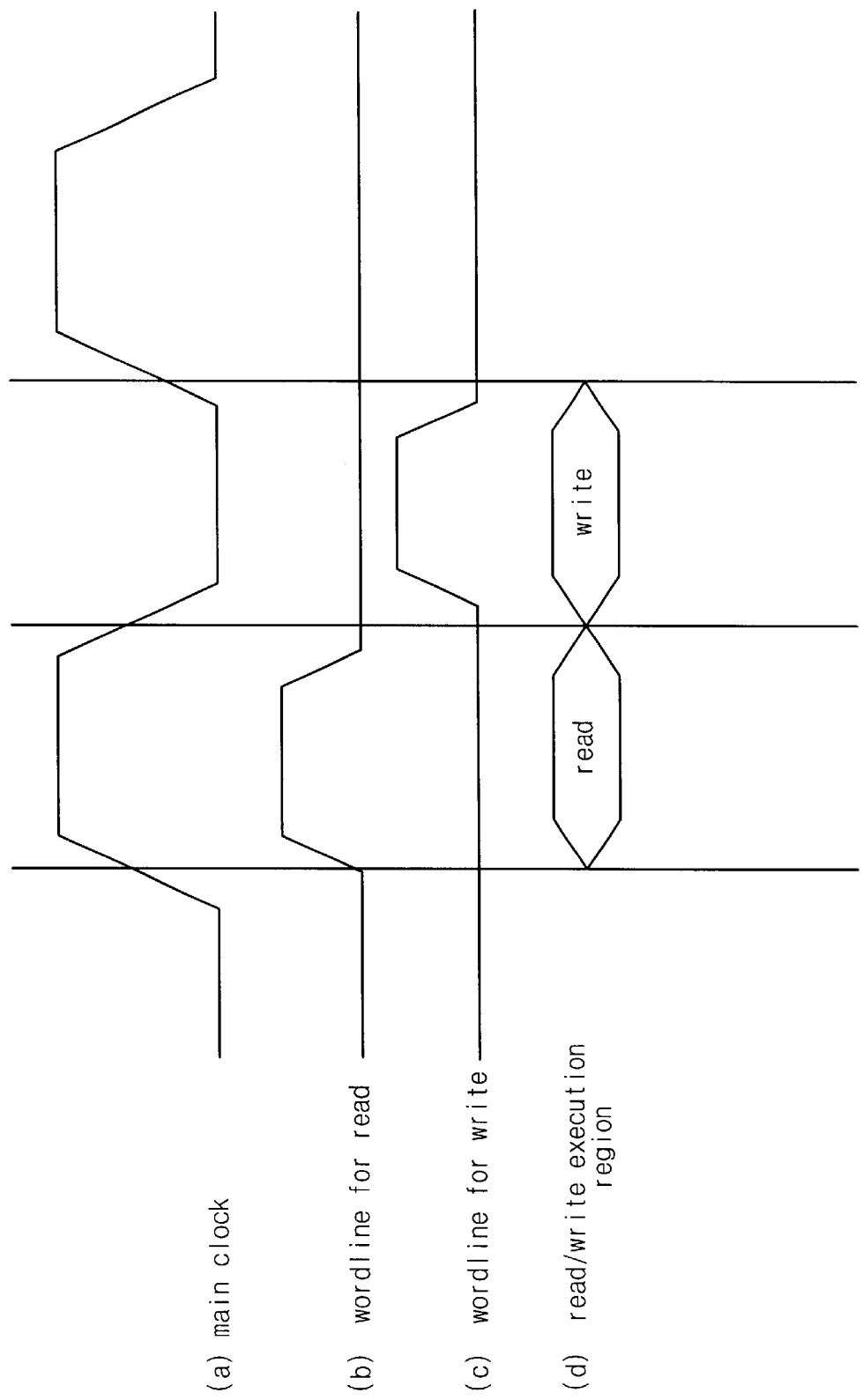
FIG. 1 is an operation timing diagram showing enable and disable time of a word line according to a main clock in read and write operations.

A method and circuit for driving a word line and a bit line for a read/write operation of a quad data rate (QDR) synchronous semiconductor memory device in accordance with a preferred embodiment of the present invention will now be described in detail with reference to the accompanying drawings. In the following description, same drawing reference numerals are used for the same elements even in different drawings, and explanations thereof will be omitted.

Firstly, the general operation properties of the QDR SRAM will now be explained. The QDR SRAM selects the read and write operations by using a read port enable bar RPEb and a write port enable bar WPEb. That is, the QDR SRAM receives the two signals in a rising edge of a main clock, and decides whether to read or write data. In the write operation, data input is performed in a double data rate (DDR) for receiving data pursuant to a rising edge and a falling edge of a clock through data input pins. In the read operation, data output is also performed in the DDR, synchronously with the rising edge and the falling edge of the clock.

In accordance with the present invention, the following methods are applied to the internal read and write operations to perform the operation of the QDR. First of all, referring to FIG. 1, half a cycle time is allocated to execute periods of the read and write operations, thereby completely separating the read and write operations. That is, to enable a word line for the read operation is started in the rising edge of the clock and finished in the succeeding falling edge, and to enable a word line for the write operation is started in the falling edge of the clock and finished before the succeeding rising edge. It is thus possible to perform the data input and the data output in the identical clock in the same ratio.

Figure 2:
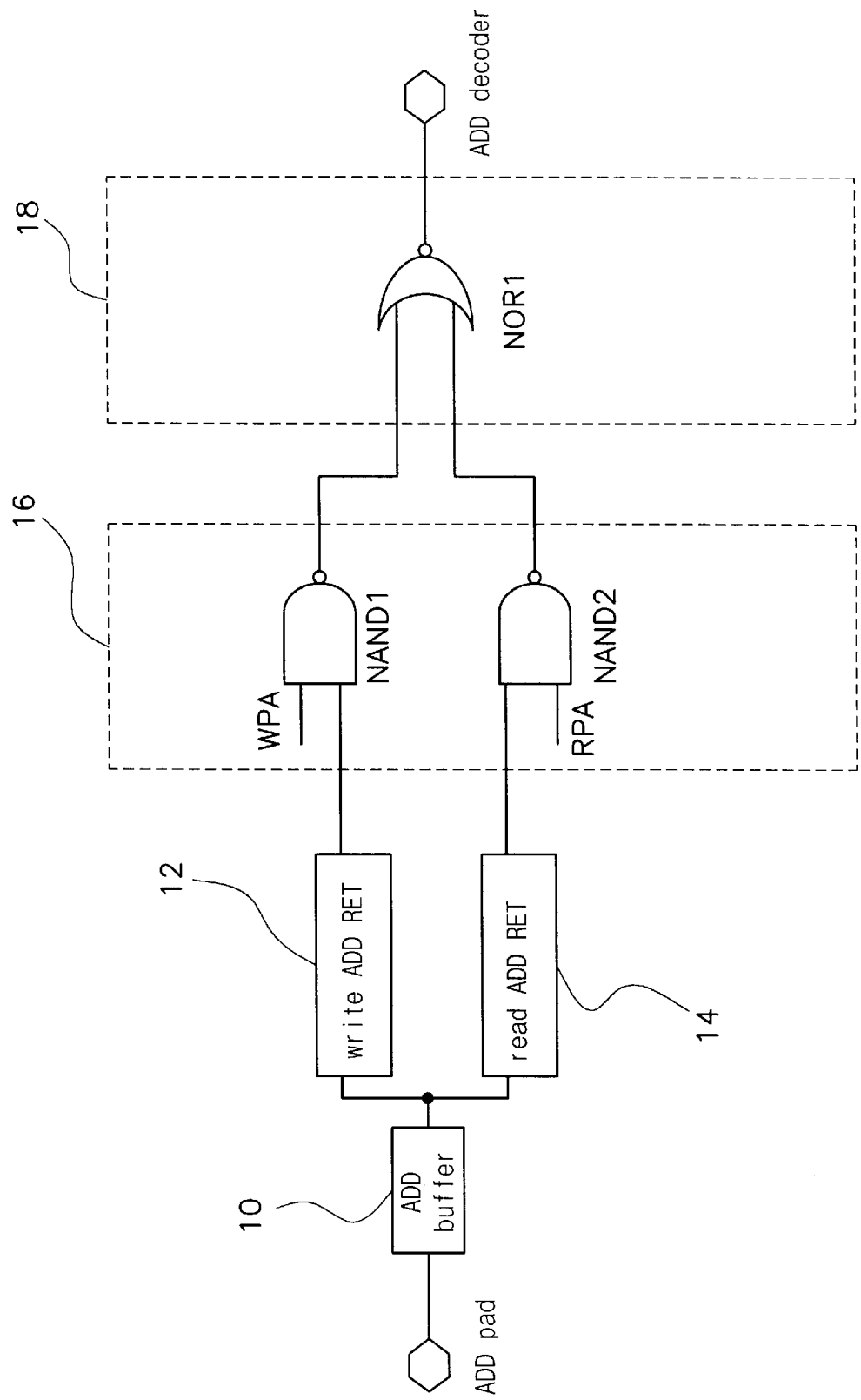
FIG. 2 is a block diagram illustrating a circuit for driving a word line and a bit line for a read/write operation of a quad data rate SRAM in accordance with the present invention.

Secondly, there has been taught a muxing method of an address decoder for a read/write operation in a structure of FIG. 2. FIG. 2 is a block diagram illustrating the circuit for driving the word line and bit line for the read/write operation of the QDR SRAM in accordance with the present invention, including: a write address register unit 12 for storing an address signal from an address buffer 10 in a write operation; a read address register unit 14 for storing an address signal from the address buffer 10 in a read operation; a write pulse address generating unit NAND1 16 for selectively outputting the output signal from the write address register unit 12 in an enable time of a write pulse address signal WPA; a read pulse address generating unit NAND2 16 for selectively outputting the output signal from the read address register unit 14 in an enable time of a read pulse address signal RPA; and a read write address multiplexer unit NOR1 18 for converting the output signals from the write pulse address generating unit NAND1 and the read pulse address generating unit NAND2 into one signal, and transmitting the converted signal to a word line and bit line decoder.

As described above, the write address register unit 12 and the read address register unit 14 are required to perform the operation of the QDR circuit. That is, the address signal from the address buffer unit 10 must be stored in the write address register unit 12 because the QDR does not directly write data in the cell in the cycle receiving a write command, but writes the signal in the cell in a proper timing.

Figure 3:
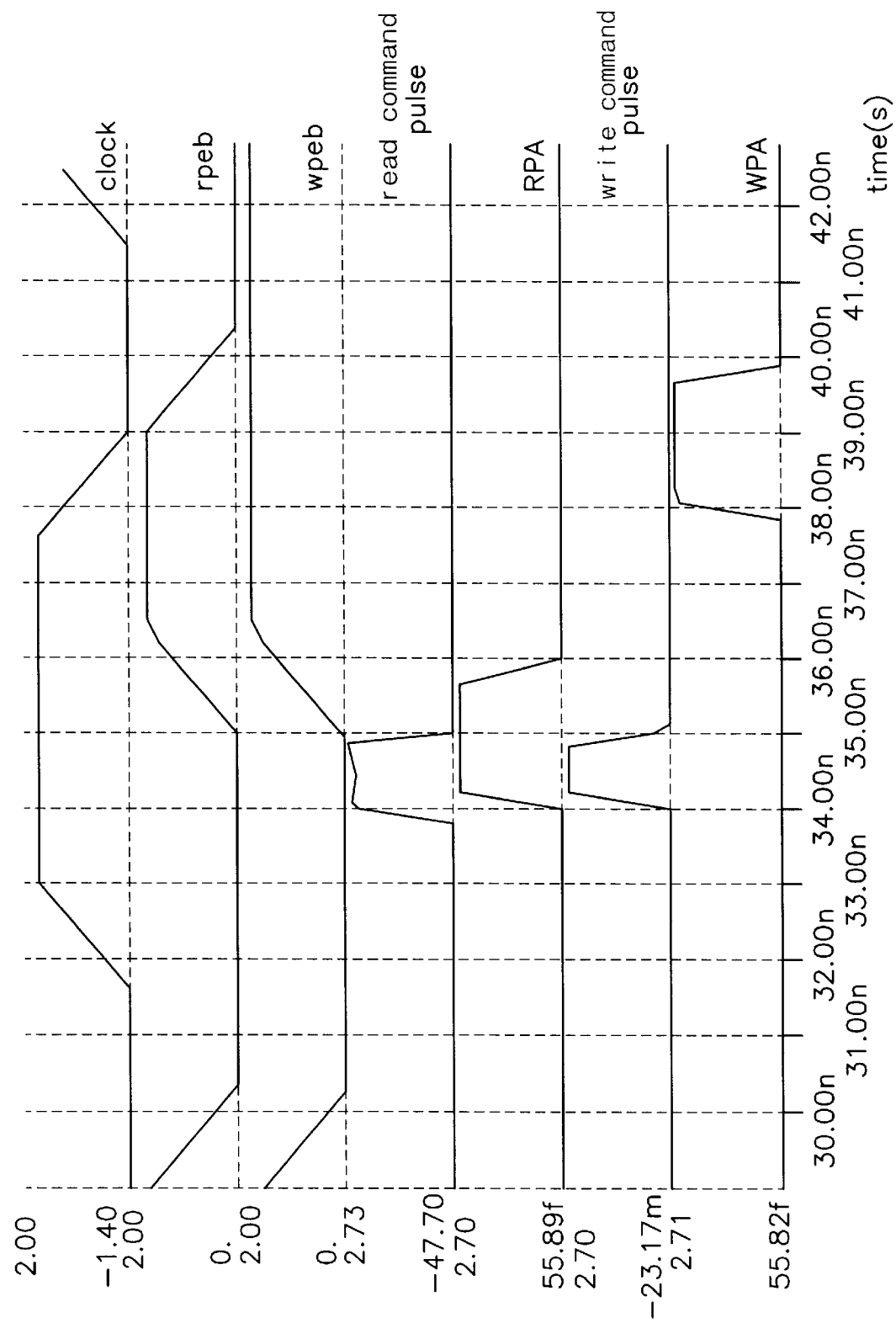
FIG. 3 is an operation timing diagram of signals in accordance with the present invention.

An internal cell decoder is driven according to the addresses from the write address register unit 12 and the read address register unit 14. Since the read and write operations are simultaneously performed in one cycle, the write pulse address WPA and the read pulse address RPA are generated for efficient decoding. As shown in FIG. 3, the read pulse address RPA is synchronized with the rising edge of the clock and generated for a predetermined time of the read operation according to a read command, and the write pulse address WPA is synchronized with the falling edge of the clock in a cycle requiring the write operation, and generated for a predetermined time. Here, a read command pulse and a write command pulse of FIG. 3 are internal signals generated synchronously with the rising edge of the clock, when rpeb and wpeb are enabled.

In the thusly-constituted circuit, the write pulse address WPA and the read pulse address RPA selectively enable the read and write signals from the respective address registers in the enable periods thereof. The read write multiplexer circuit unit 18 connects the two kinds of address signals through one bus. Accordingly, the read address and the write address can drive the word line and the bit line in one cycle, without interfering with each other.

Figure 4:
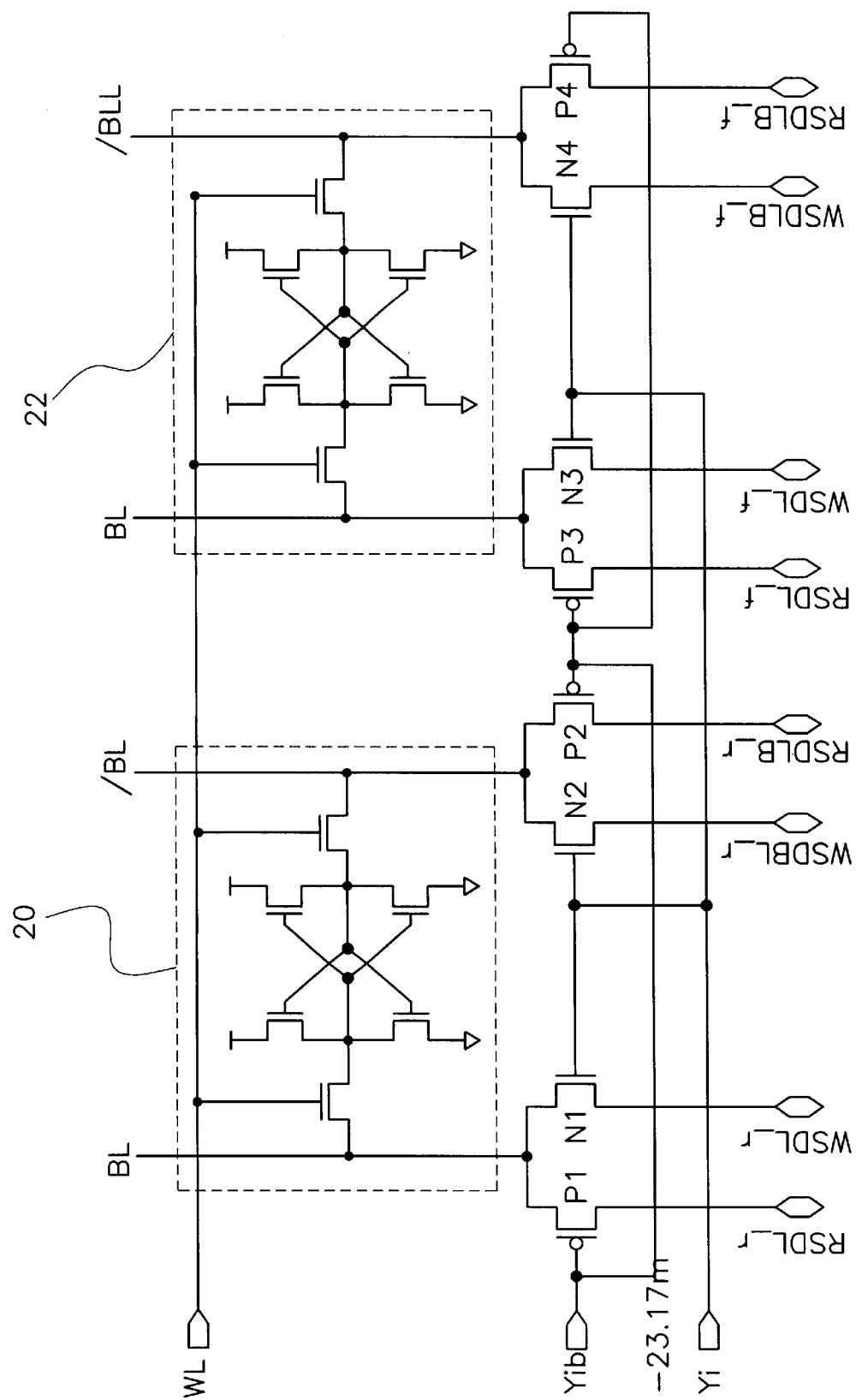
FIG. 4 is a circuit diagram illustrating a circuit for driving a word line and a bit line for a read/write operation of a QDR SRAM in accordance with another embodiment of the present invention, for selecting a column used in a prefetched read operation.

Thirdly, a prefetched method is applied to the data read method of the cell. In the prefetched method, two cells are simultaneously read in one data read operation. Therefore, the read data can be sent out from the rising edge and the falling edge. As shown in FIG. 4, the prefetched method is embodied by selecting two cells at the same time according to one column select signal yi.

Figure 5:
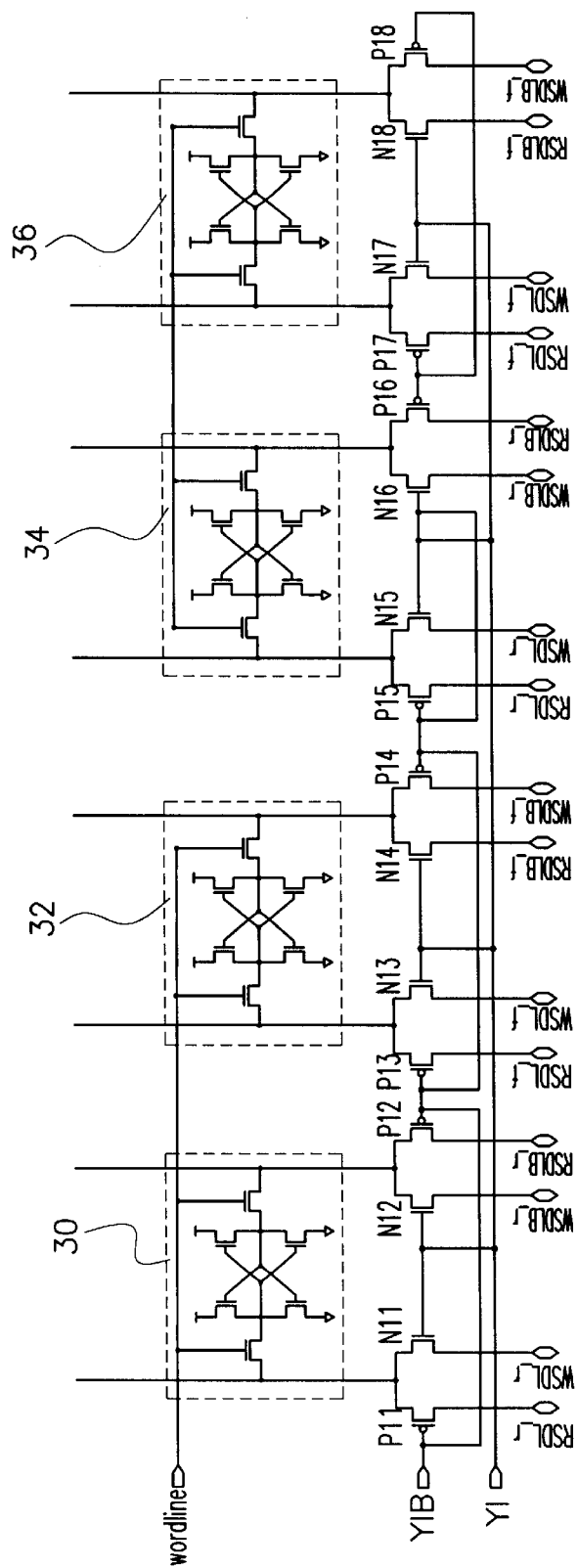
FIG. 5 is a circuit diagram illustrating a circuit for driving a word line and a bit line for a read/write operation of a QDR SRAM in accordance with yet another embodiment of the present invention, for selecting a column for accessing four cells in a prefetched read operation at the same time.

The read and write operations of the QDR SRAM can also be executed by reading or writing all data in one cycle in a burst length. For example, when the burst length is '4', the QDR device can perform the read or write operation by simultaneously accessing four cells according to one read or write command. It can be implemented when one column select signal yi enables the four cells at the same time as shown in FIG. 5.

As discussed earlier, in accordance with the present invention, the read and write operations are performed in one cycle. It is thus possible to perform the read and write operations in the same ratio in the QDR device where the read and write operations are separately performed in the DDR. In addition, the prefetched method is applied to the read operation, so that the QDR SRAM can be designed in a burst length 2 reading and writing two data according to one address variation, a burst length 4 reading and writing four data according to one address variation, and other different burst lengths. Moreover, the word line and bit line decoder can be used through the muxing of the read and write addresses, instead of individually using a write decoder and a read decoder. As a result, a chip layout size is reduced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for driving a quad data rate synchronous semiconductor memory device, comprising the steps of:
    enabling a word line for a read operation by being synchronized with a rising edge of a clock cycle, and disabling word line and bit line select signals for the read operation before a falling edge of the clock cycle; and
    enabling a word line for a write operation by being synchronized with the falling edge of the clock cycle, and disabling word line and bit line select signals for the write operation before a rising edge of a succeeding clock cycle.

2. The method according to claim 1, wherein the step for the read operation comprises simultaneously reading two cells in one read operation among a plurality of cells corresponding to the enabled word line.

3. The method according to claim 2, wherein the two cells reading is performed by selecting two cells at the same time according to one column select signal.

4. The method according to claim 1, wherein the step for the read operation comprises:
    simultaneously reading two memory cells in one read operation among a plurality of memory cells corresponding to the enabled word line;
    generating a first pulse which becomes a high level by being synchronized with the rising edge of the clock cycle, and which becomes a low level before the falling edge; and
    outputting data from the two memory cells by respectively synchronizing them with the rising edge and the falling edge of the first pulse.

5. The method according to claim 1 or 4, wherein the step for the write operation comprises:
    generating a second pulse which becomes a high level by being synchronized with the falling edge of the clock cycle, and which becomes a low level before the rising edge of the succeeding clock cycle; and
    recording data on two memory cells by respectively synchronizing them with the rising edge and the falling edge of the second pulse.

6. A circuit for driving a quad data rate synchronous semiconductor memory device, comprising:
    an address buffer for buffering an external address signal;
    a write address storing unit for receiving an address signal corresponding to a write operation from the address buffer, and storing the received signal;
    a read address storing unit for receiving an address signal corresponding to a read operation from the address buffer, and storing the received signal; and
    an address combining unit for receiving the write address signal from the write address storing unit and the read address signal from the read address storing unit, and combining the two address signals to be separated in time in one clock cycle.

7. The circuit according to claim 6, wherein the address combining unit comprises:
    a read pulse address generating unit for receiving the read address signal from the read address storing unit, and outputting the read address signal synchronized with the rising edge of the clock cycle for a predetermined time of the read operation;
    a write pulse address generating unit for receiving the write address signal from the write address storing unit, and outputting the write address signal synchronized with the falling edge of the clock cycle for a predetermined time of the write operation; and
    a multiplexer for combining the output signal from the read pulse address generating unit and the output signal from the write pulse address generating unit.

8. The circuit according to claim 7, wherein the read pulse address generating unit finishes outputting the read address signal before the falling edge of the clock cycle.

9. The circuit according to claim 8, wherein the read pulse address generating unit comprises a NAND gate having its one input terminal connected to receive the pulse signal which becomes a high level in the rising edge of the clock cycle and which becomes a low level before the falling edge, and its other input terminal connected to receive the output signal from the read address storing unit.

10. The circuit according to claim 7 or 8, wherein the write pulse address generating unit finishes outputting the write address signal before the rising edge of the succeeding clock cycle.

11. The circuit according to claim 10, wherein the write pulse address generating unit comprises a NAND gate having its one input terminal connected to receive the pulse signal which becomes a high level in the falling edge of the clock cycle and which becomes a low level before the falling edge of the succeeding clock cycle, and its other input terminal connected to receive the output signal from the write address storing unit.

12. The circuit according to claim 6, wherein the multiplexer comprises an OR gate having its one input terminal connected to receive the output signal from the read pulse address generating unit, and its other input terminal connected to receive the output signal from the write pulse address generating unit.

13. The circuit according to claim 6, wherein a memory cell array of the semiconductor memory device is designed so that two cells can be simultaneously selected according to one column select signal among a plurality of cells corresponding to one word line.

14. A method for driving a synchronous semiconductor memory device having a memory cell array for storing data, comprising the steps of:

generating M (M is a natural number) pulses separated in time in one clock cycle when a burst length of the semiconductor memory device is 2N (N is a natural number);

combining M addresses in one clock cycle by using the M pulses; and reading or writing 2M data from/on a memory cell array corresponding to the addresses, by respectively synchronizing them with the rising edges and falling edges of the M pulses.

15. The method according to claim 14, wherein M is identical to N.

16. The method according to claim 14 or 15, wherein the step for reading or writing the data comprises simultaneously selecting 2N memory cells according to one column select signal.

17. The method according to claim 14, wherein M and N denote 2, one pulse of one clock cycle corresponds to the read operation, and the other pulse corresponds to the write operation.

* * * * *